United States Patent
Yoon et al.

(10) Patent No.: US 10,616,805 B2
(45) Date of Patent: Apr. 7, 2020

(54) OPERATION METHODS OF TERMINAL AND BASE STATION IN MOBILE COMMUNICATION NETWORKS

(71) Applicant: Electronics and Telecommunications Research Institute, Daejeon (KR)

(72) Inventors: Chan Ho Yoon, Daejeon (KR); Young Jo Ko, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/673,013

(22) Filed: Aug. 9, 2017

(65) Prior Publication Data
US 2018/0049065 A1    Feb. 15, 2018

(30) Foreign Application Priority Data

Aug. 11, 2016    (KR) .................. 10-2016-0102593
Aug. 1, 2017    (KR) .................. 10-2017-0097849

(51) Int. Cl.
| H04L 12/28 | (2006.01) |
|---|---|
| H04W 28/16 | (2009.01) |
| H04L 5/00 | (2006.01) |
| H03M 13/27 | (2006.01) |
| H03M 13/00 | (2006.01) |
| H04J 13/16 | (2011.01) |
| H04J 11/00 | (2006.01) |
| H04W 72/04 | (2009.01) |

(52) U.S. Cl.
CPC ......... *H04W 28/16* (2013.01); *H03M 13/276* (2013.01); *H03M 13/2732* (2013.01); *H03M 13/6525* (2013.01); *H04L 5/0007* (2013.01); *H04L 5/0055* (2013.01); *H04J 11/005* (2013.01); *H04J 13/16* (2013.01); *H04L 5/0001* (2013.01); *H04W 72/04* (2013.01)

(58) Field of Classification Search
CPC .............. H04W 28/16; H03M 13/276; H03M 13/6525; H03M 13/2732
See application file for complete search history.

(56) References Cited

U.S. PATENT DOCUMENTS

| 8,555,133 B2 | 10/2013 | Cho et al. |
| 2010/0067464 A1 | 3/2010 | Higuchi |
| 2011/0268054 A1* | 11/2011 | Abraham .............. H04W 74/06 370/329 |

(Continued)

*Primary Examiner* — Bo Hui A Zhu
(74) *Attorney, Agent, or Firm* — Rabin & Berdo, P.C.

(57) ABSTRACT

Disclosed are operation methods of a terminal and a base station in mobile communications. The operation method of the terminal in a mobile communication network, comprises receiving a terminal identifier from a base station; generating a plurality of interleaving parameters based on the terminal identifier; dividing a channel-coded data block into a plurality of sub-blocks, and performing a block interleaving on each of the plurality of sub-blocks using the plurality of interleaving parameters; and transmitting the plurality of sub-blocks on which the block interleaving has been performed, wherein an interleaving pattern of the block interleaving for each of the plurality of sub-blocks is determined by the plurality of interleaving parameters.

8 Claims, 11 Drawing Sheets

(56) References Cited

U.S. PATENT DOCUMENTS

2012/0093014 A1    4/2012    Hong et al.
2016/0127085 A1    5/2016    Kim et al.
2017/0156131 A1*  6/2017    Kimura .................... H04J 11/00
2017/0244428 A1*  8/2017    Kimura ..................... H04L 1/00

* cited by examiner

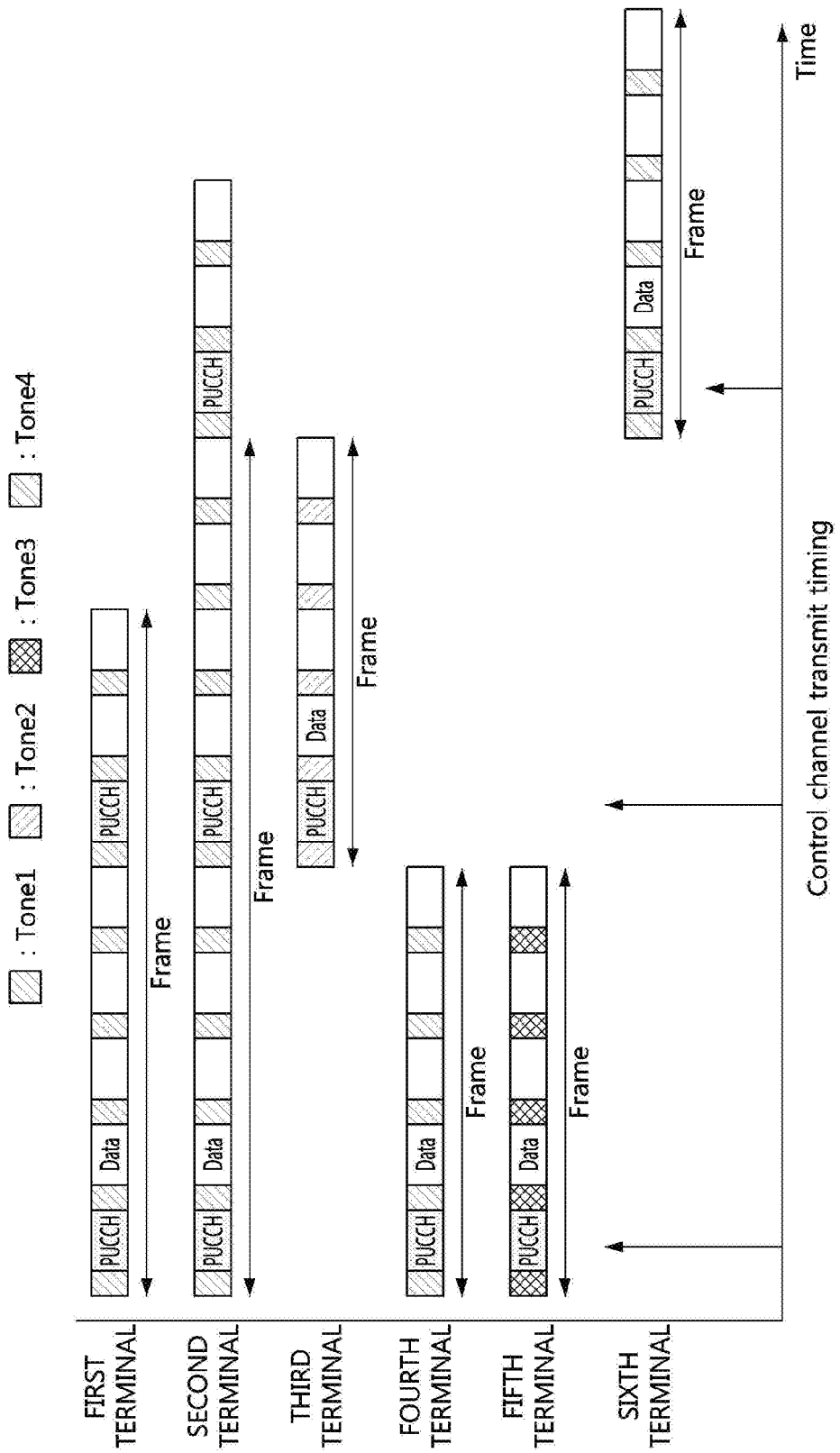

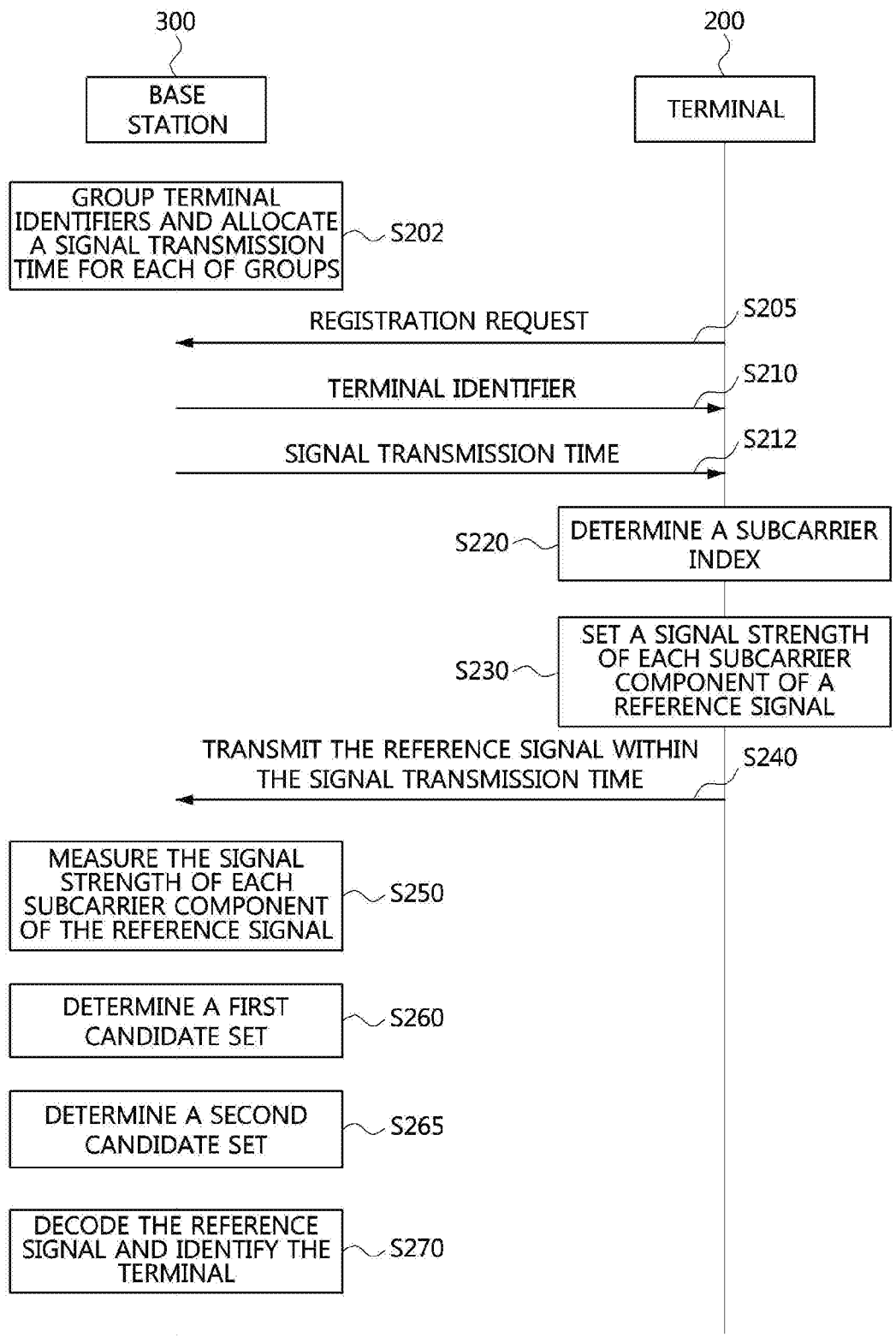

OPERATION METHODS OF TERMINAL AND BASE STATION IN MOBILE COMMUNICATION NETWORKS

CLAIM FOR PRIORITY

This application claims priorities to Korean Patent Applications No. 2016-0102593 filed on Aug. 11, 2016 and No. 2017-0097849 filed on Aug. 1, 2017 in the Korean Intellectual Property Office (KIPO), the entire contents of which are hereby incorporated by reference.

BACKGROUND

1. Technical Field

The present disclosure relates to methods of operating a terminal and a base station in a mobile communication network, and more particularly, to methods of operating a terminal and a base station to enable the base station to identify the terminal transmitting a signal.

2. Related Art

A communication system includes a core network (e.g., a mobility management entity (MME), a serving gateway (SGW), a packet data network (PDW)), a base station (e.g., a macro base station, a small base station, a relay, etc.), a terminal, and the like.

Communications between the base station and the terminal may be performed using various radio access technologies (RATs) (e.g., a $4^{th}$ generation (4G) communication technology, a $5^{th}$ generation (5G) communication technology, a wireless broadband (WiBro technology, a wireless local area network (WLAN) technology, etc.).

In a conventional mobile communication network, an orthogonal transmission scheme has been adopted for uplink signal transmission. That is, terminals may transmit uplink signals using orthogonal resources in the time or frequency domain, and a base station may demodulate the signals received from the terminals without being affected by interferences.

However, in order for orthogonality to be guaranteed for uplink signal transmission of terminals, the terminals are required to receive scheduling information from the base station. For this, a process, in which the terminal transmits a scheduling request (SR) to the base station and the base station transmits scheduling information to the terminal in response to the SR, is required. This process results in delay and power consumption in the uplink signal transmission. In particular, in a case that the amount of uplink data transmission is small and the number of uplink signal transmissions is large, inefficiency of such the orthogonal transmission scheme may be remarkably increased.

In order to overcome the above-described problems, a non-orthogonal or contention-based transmission scheme may be used for uplink transmission. However, there is currently no clear solution for non-orthogonal uplink transmission scheme in a licensed band mobile communication network. In the case of the non-orthogonal, contention-based scheme, the base station may not know at what frequency components the terminal transmits the uplink signal. A base station may identify the terminal transmitting a signal by using a specific pattern transmitted by the terminal. However, in a case that the number of terminals connected to the base station is large, identification of the terminal by the base station may become difficult.

SUMMARY

Accordingly, exemplary embodiments of the present disclosure are provided to substantially obviate one or more problems due to limitations and disadvantages of the related art.

Exemplary embodiments of the present disclosure provide methods of operating a terminal and a base station in a mobile communication network. More specifically, the exemplary embodiments of the present disclosure provide methods of operating a terminal and a base station to enable the base station to identify the terminal transmitting a signal.

Technical objects of the present disclosure are not limited to the aforementioned technical objects and other technical objects which are not mentioned will be apparently appreciated by those skilled in the art from the following description.

In order to achieve the above-described objective, an aspect of the present disclosure provides an operation method of a terminal in a mobile communication network. The method may comprise receiving a terminal identifier from a base station; generating a plurality of interleaving parameters based on the terminal identifier; dividing a channel-coded data block into a plurality of sub-blocks, and performing a block interleaving on each of the plurality of sub-blocks using the plurality of interleaving parameters; and transmitting the plurality of sub-blocks on which the block interleaving has been performed, wherein an interleaving pattern of the block interleaving for each of the plurality of sub-blocks is determined by the plurality of interleaving parameters.

The plurality of interleaving parameters may be generated by dividing the terminal identifier into a plurality of bit strings of a predetermined size; and determining numbers represented respectively by the plurality of bit strings as the plurality of interleaving parameters.

The terminal identifier may include a Cell Radio Network Temporary Identifier (C-RNTI).

The terminal identifier may have a size of 16 bits, the plurality of interleaving parameters may be generated by dividing the terminal identifier into four bit strings each of which has a size of 4 bits; and determining numbers represented respectively by the four bit strings as first to fourth interleaving parameters.

The block interleaving may be performed by interleaving bit strings of each of the plurality of sub-blocks using the first interleaving parameter; interleaving the bit strings interleaved by the first interleaving parameter using the second interleaving parameter; interleaving the bit strings interleaved by the second interleaving parameter using the third interleaving parameter; and interleaving the bit strings interleaved by the third interleaving parameter using the fourth interleaving parameter.

The method may further comprise receiving a random sequence from the base station; and performing a random interleaving on each of the plurality of sub-blocks on which the block interleaving has been performed by using the random sequence.

The method may further comprise performing a scrambling on each of the plurality of sub-blocks on which the block interleaving has been performed.

The scrambling on each of the plurality of sub-blocks may be performed by adding a pseudo-random sequence to each of the plurality of sub-blocks on which the block interleaving has been performed; and calculating remainders obtained by dividing each component of each of the plurality of sub-blocks to which the pseudo-random sequence is added by two.

The method may further comprise receiving information about a signal transmission time allocated to the terminal identifier, and in the transmitting the plurality of sub-blocks, the plurality of sub-blocks may be transmitted at the signal transmission time allocated to the terminal identifier.

In order to achieve the above-described objective, another aspect of the present disclosure provides an operation method of a terminal in a mobile communication network. The method may comprise receiving a terminal identifier from a base station; determining a subcarrier index based on the terminal identifier; determining, based on the subcarrier index, a signal strength of each subcarrier component; and transmitting a reference signal according to the determined signal strength of each subcarrier component.

In the determining a signal strength of each subcarrier component, a signal strength of a subcarrier component corresponding to the determined subcarrier index may be set to be greater than a threshold value, and signal strengths of remaining subcarrier components may be set to be equal to or lower than the threshold value.

The signal strength of each subcarrier component may be determined by dividing the terminal identifier into a plurality of bit strings of a predetermined size; and determining numbers represented respectively by the plurality of bit strings as interleaving parameters.

The terminal identifier may include a Cell Radio Network Temporary Identifier (C-RNTI).

The terminal identifier may have a size of 16 bits, and the subcarrier index may be determined by dividing the terminal identifier into four bit strings each of which has a size of 4 bits; and determining the sub-carrier index based on numbers represented respectively by the four bit strings.

The method may further comprise receiving information about a signal transmission time allocated to the terminal identifier, wherein, in the transmitting the reference signal, the reference signal is transmitted at the signal transmission time allocated to the terminal identifier.

In order to achieve the above-described objective, yet another aspect of the present disclosure provides an operation method of a base station in a mobile communication network. The method may comprise transmitting a terminal identifier to a terminal; receiving a reference signal from the terminal; measuring a signal strength of each of subcarrier components of the reference signal; determining a subcarrier index used for generating the reference signal based on the measured signal strength of each of subcarrier components of the reference signal; determining, based on the subcarrier index, a first candidate set for the terminal transmitting the reference signal; and identifying the terminal transmitting the reference signal within the first candidate set.

The subcarrier index may be determined by comparing the measured signal strength of each of the subcarrier components of the reference signal with a threshold value; and determining the subcarrier index from a result of the comparison.

The subcarrier index may be determined by decoding the reference signal using decoding schemes corresponding to terminals included in the first candidate set; and identifying the terminal transmitting the reference signal by performing a cyclic redundancy check (CRC) on a result of the decoding.

The method may further comprise grouping terminal identifiers into a plurality of groups; allocating a signal transmission time to each of the plurality of groups; and transmitting information about a signal transmission time allocated to a group to which the terminal belongs.

The method may further comprise determining a second candidate set for the terminal transmitting the reference signal based on a time at which the reference signal is received from the terminal and, in the identifying the terminal, the terminal transmitting the reference signal may be identified within an intersection of the first candidate set and the second candidate set.

According to embodiments of the present disclosure, the base station can identify a terminal transmitting the uplink signal even if the terminal is not allocated uplink resource from the base station. Further, the base station can determine a candidate set for the terminal transmitting the uplink signal based on a signal strength of each subcarrier component of the uplink signal or a transmission time of the uplink signal. Thus, a process by which the base station identifies the terminal may be simplified.

BRIEF DESCRIPTION OF DRAWINGS

Example embodiments of the present invention will become more apparent by describing in detail example embodiments of the present invention with reference to the accompanying drawings, in which:

FIG. 11 is a conceptual diagram illustrating reference signal transmission of terminals; and FIG. 12 is a flowchart illustrating an uplink signal transmission process according to a sixth embodiment of the present disclosure.

DESCRIPTION OF EXAMPLE EMBODIMENTS

Figure 1:
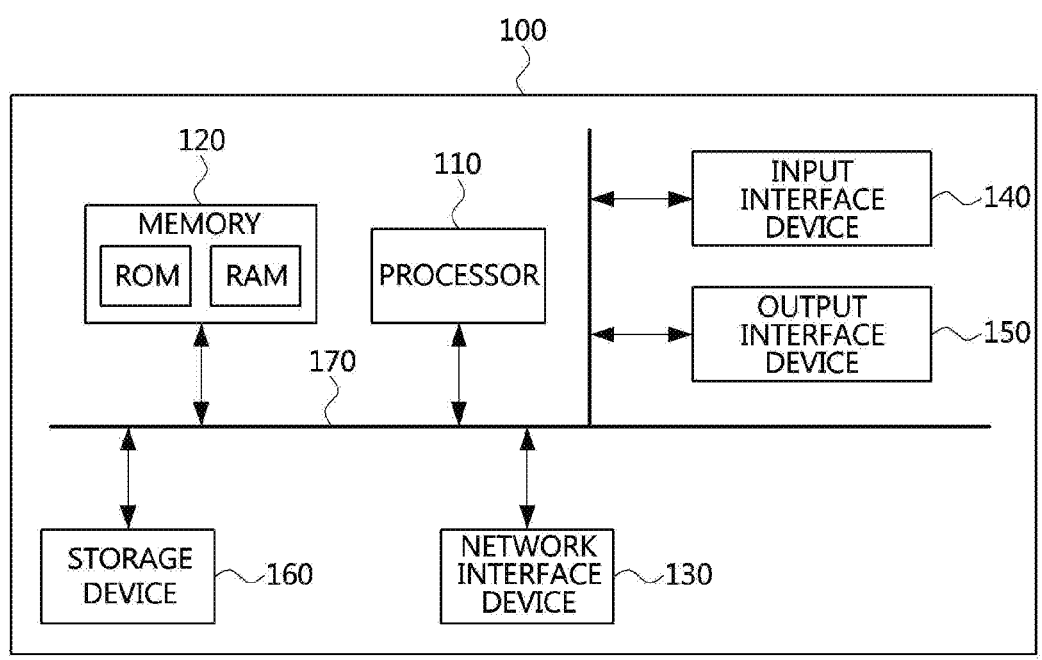
FIG. 1 is a conceptual diagram illustrating a first embodiment of a cellular communication system.

Embodiments of the present disclosure are disclosed herein. However, specific structural and functional details disclosed herein are merely representative for purposes of describing embodiments of the present disclosure, however, embodiments of the present disclosure may be embodied in many alternate forms and should not be construed as limited to embodiments of the present disclosure set forth herein.

Accordingly, while the present disclosure is susceptible to various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described in greater detail with reference to the accompanying drawings. In order to facilitate general understanding in describing the present disclosure, the same components in the drawings are denoted with the same reference signs, and repeated description thereof will be omitted.

Hereinafter, wireless communication networks to which exemplary embodiments according to the present disclosure will be described. However, wireless communication networks to which exemplary embodiments according to the present disclosure are applied are not restricted to what will be described below. That is, exemplary embodiments according to the present disclosure may be applied to various wireless communication networks.

FIG. 1 is a conceptual diagram illustrating a first embodiment of a cellular communication system.

Referring to FIG. 1, a communication system 100 may comprise a plurality of communication nodes 110-1, 110-2, 110-3, 120-1, 120-2, 130-1, 130-2, 130-3, 130-4, 130-5, and 130-6. Also, the communication system 100 may comprise a core network (e.g., a serving gateway (S-GW), a packet data network (PDN) gateway (P-GW), a mobility management entity (MME), and the like).

The plurality of communication nodes may support $4^{th}$ generation (4G) communication (e.g., long term evolution (LTE), LTE-advanced (LTE-A)), or $5^{th}$ generation (5G) communication defined in the $3^{rd}$ generation partnership project (3GPP) standard. The 4G communication may be performed in a frequency band below 6 gigahertz (GHz), and the 5G communication may be performed in a frequency band above 6 GHz. For example, for the 4G and 5G communications, the plurality of communication nodes may support at least one communication protocol among a code division multiple access (CDMA) based communication protocol, a wideband CDMA (WCDMA) based communication protocol, a time division multiple access (TDMA) based communication protocol, a frequency division multiple access (FDMA) based communication protocol, an orthogonal frequency division multiplexing (OFDM) based communication protocol, an orthogonal frequency division multiple access (OFDMA) based communication protocol, a single carrier PUMA (SC-FDMA) based communication protocol, a non-orthogonal multiple access (NOMA) based communication protocol, and a space division multiple access (SDMA) based communication protocol. Also, each of the plurality of communication nodes may have the following structure.

Figure 2:
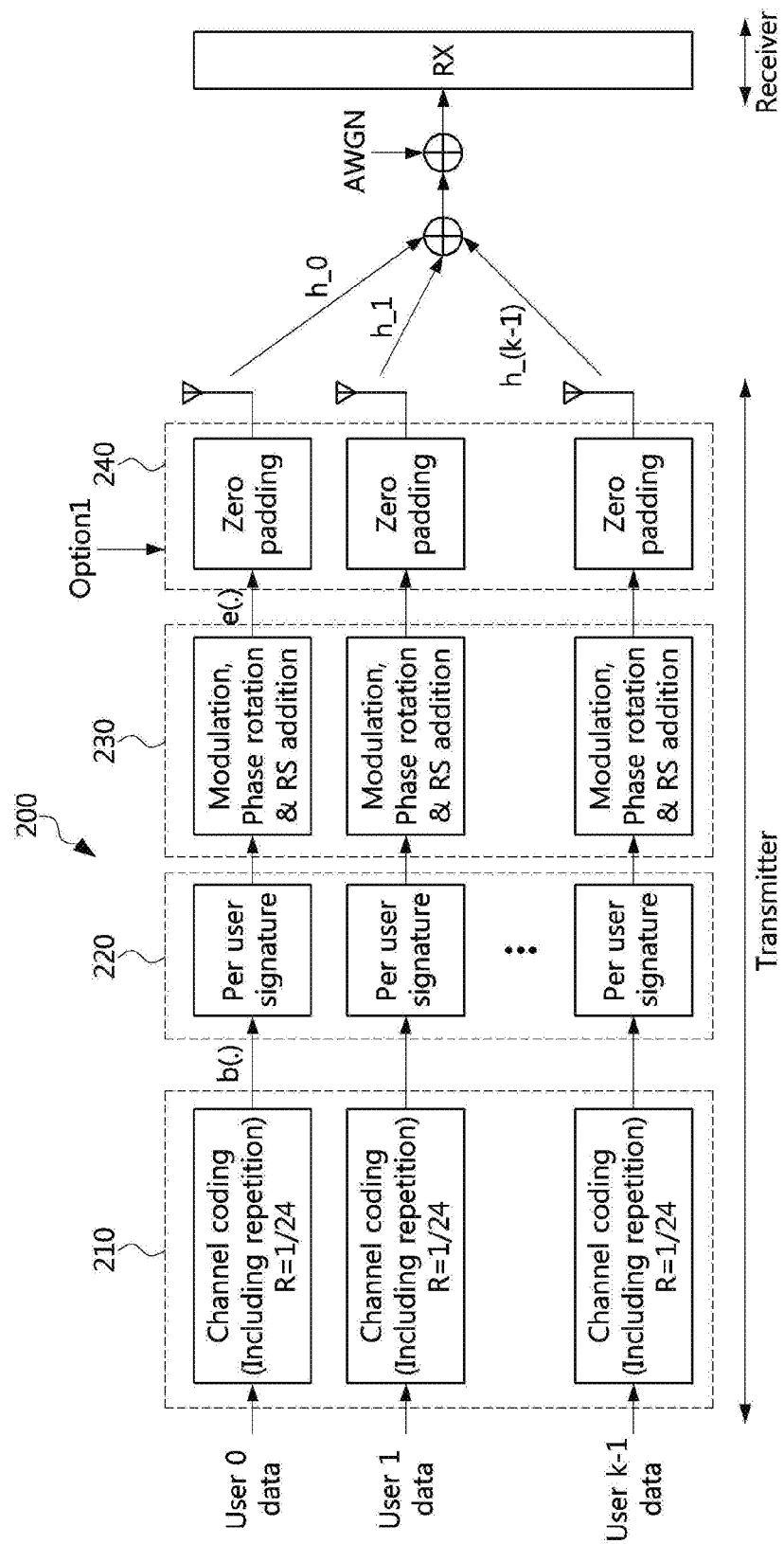
FIG. 2 is a block diagram illustrating a transmission end of a terminal according to a first embodiment of the present disclosure.

FIG. 2 is a block diagram illustrating a transmission end of a terminal according to a first embodiment of the present disclosure.

In the embodiment illustrated in FIG. 2, a transmission end of a terminal 200 is illustrated as including multiple function blocks. Function blocks may be physically separated from each other, but they may exist as integrated. For example, functions performed in a plurality of function blocks may be performed in a single function block.

Referring to FIG. 2, a channel coding block 210 may receive data to be transmitted by a terminal 200. The channel coding block 210 may output a channel-coded data block according to the input data. The channel coded data block output from the channel coding block 210 may represent a data transmitted by the terminal 200. The channel coded data block may be input to interleaving block 220.

The interleaving block 220 may divide the channel-coded data block into a plurality of sub-blocks. The interleaving block 220 may perform a block interleaving on each of the plurality of sub-blocks. An interleaving pattern of the block interleaving may depend on terminal identifier of the terminal 200 described later. Interleaved sub-blocks may be input to the modulation block 230.

The modulation block 230 may modulate and change a phase of signal according to the plurality of sub-blocks on which the block interleaving has been performed. The modulation block 230 may add a reference signal or the like. The modulation block 230 may perform scrambling. The scrambling may mean changing a bit string of the sub-blocks according to a predetermined rule.

A pseudo-random sequence may be used for the scrambling, which will be described in detail below. A bit string output from the modulation block 230 may be input to the padding block 240. The padding block 240 may change the length of the bit string received from the modulation block 230. For example, the padding block 240 may add predetermined sequence to the bit string so that the length of the bit string is equal to a predetermined size.

According to FIG. 2, the terminal 200 may transmit an uplink signal using a single carrier modulation scheme. However, the embodiment of the present disclosure is not limited thereto.

Figure 3:
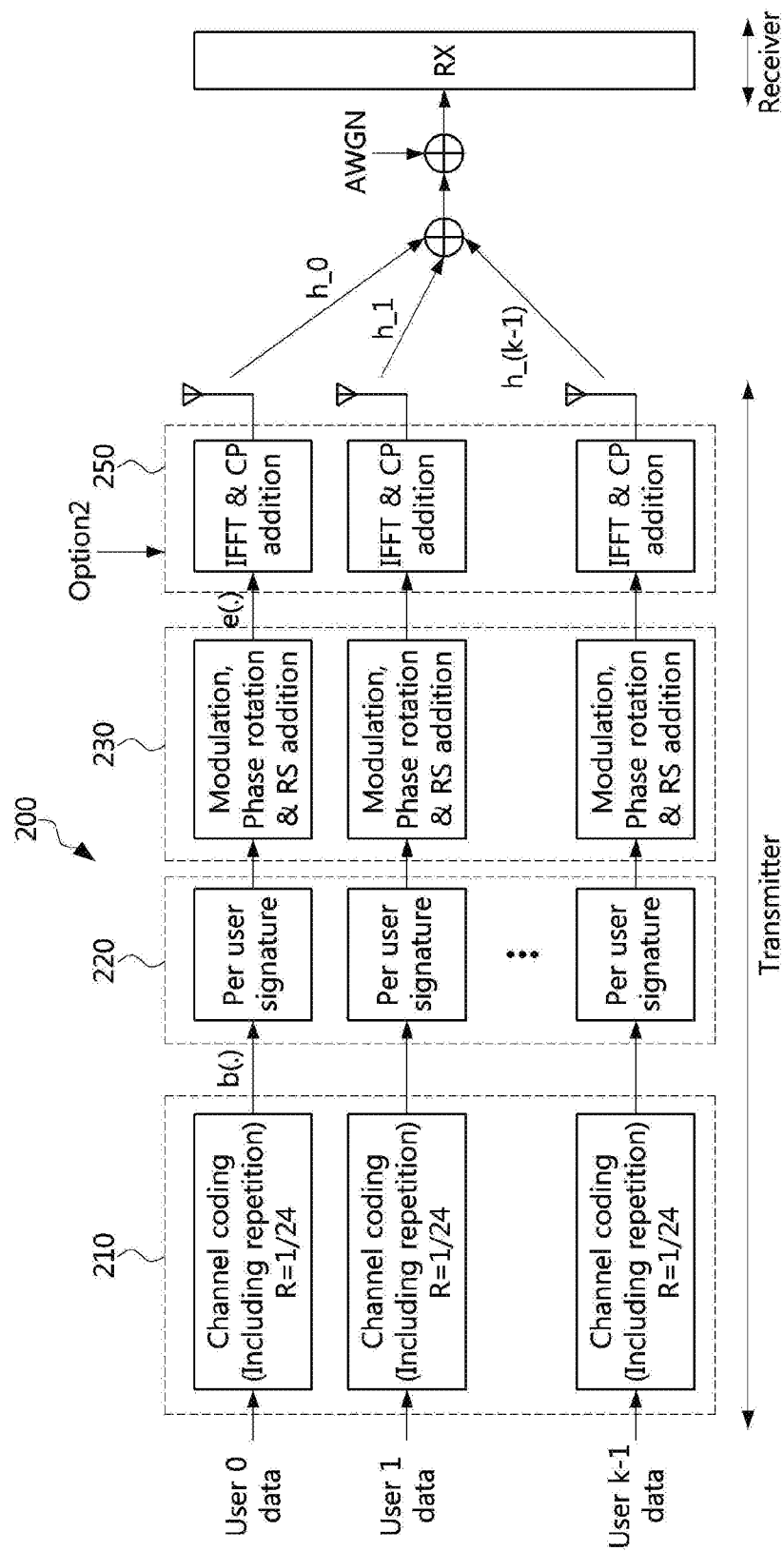
FIG. 3 is a block diagram illustrating a transmission end of the terminal according to a second embodiment of the present disclosure.

FIG. 3 is a block diagram illustrating a transmission end of the terminal according to a second embodiment of the present disclosure. In the following description of the embodiment of FIG. 3, the description overlapping with FIG. 2 is omitted.

Referring to FIG. 3, a signal output from the modulation block 230 may be input to an OFDM block 250. The OFDM block 250 may perform inverse fast Fourier transformation (IFFT) of the input signal. The OFDM block 250 may insert Cyclic Prefix (CP) between OFDM subcarriers. The uplink signal may be transmitted by a multi-carrier scheme.

Figure 4:
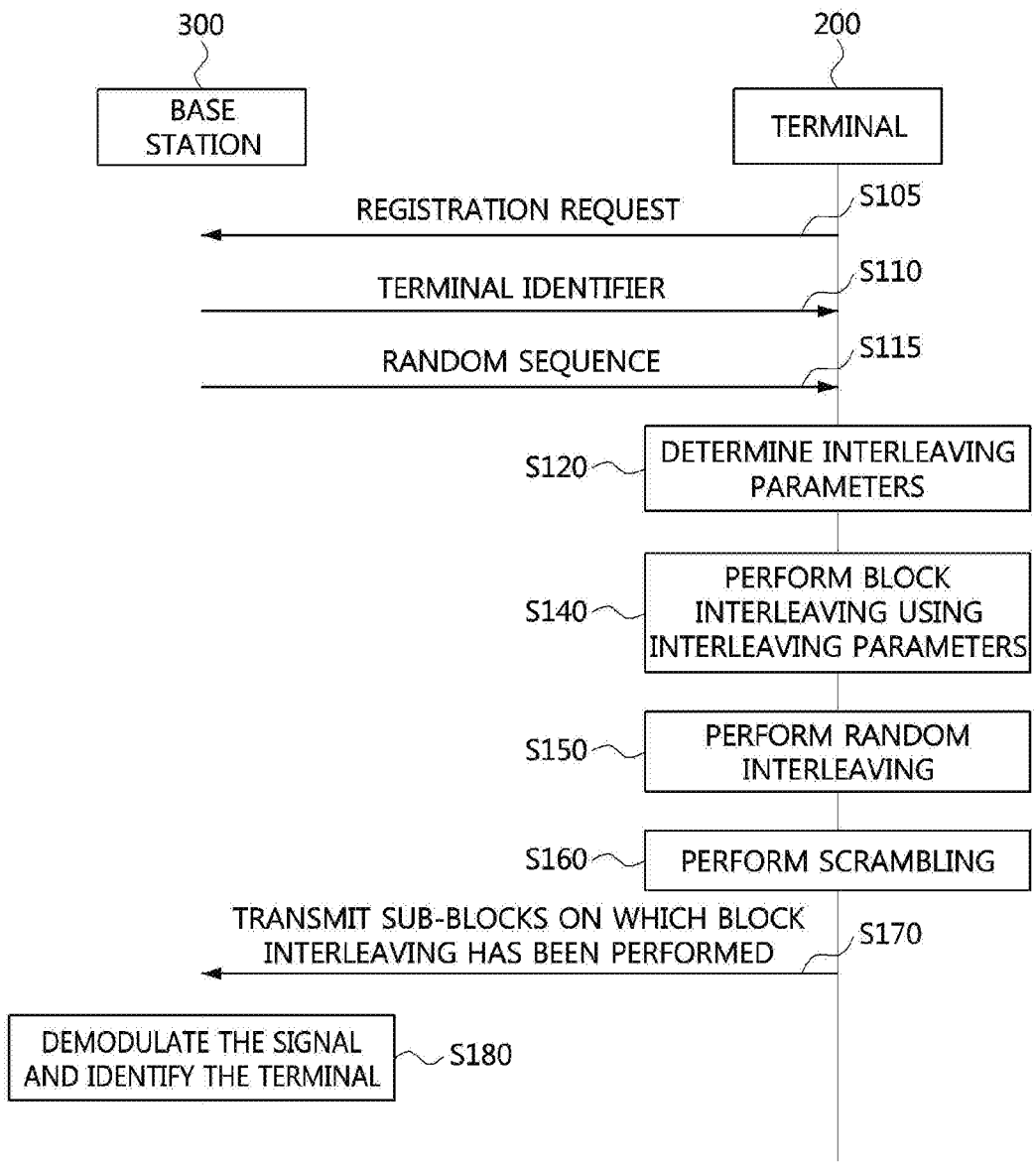
FIG. 4 is a flowchart illustrating an uplink signal transmission process of the terminal 200 according to a third embodiment of the present disclosure.

FIG. 4 is a flowchart illustrating an uplink signal transmission process of the terminal 200 according to a third embodiment of the present disclosure.

Referring to FIG. 4, in step S105, the terminal 200 may transmit a registration request. The base station 300 may receive the registration request from the terminal 200. The base station 300 may manage information about the terminal 200, and provide services to the terminal 200. The information of the terminal 200 may comprise a terminal identifier. For example, the terminal identifier may comprise Cell Ratio Network Temporary Identifier (C-RNTI). The terminal identifier may have a size of 16 bits. However, the above-described examples and numerical values are illustrative and the embodiments of the present disclosure are not limited thereto. For example, the terminal identifier may have size smaller than or larger than 16 bits.

In step S110, the base station 300 may transmit the terminal identifier in response to the registration request. The terminal 200 may receive the terminal identifier from the base station 300.

In step S115, the base station 300 may transmit a random sequence. The terminal 200 may receive the random sequence from the base station 300. The random sequence may be used in the random interleaving process described below. In step S110, the base station 300 may transmit different terminal identifiers to different terminals. On the other hand, in step S115, the base station 300 may transmit the same random sequence to terminals within a coverage of the base station 300. The base station 300 may further transmit the cell ID of the base station 300 together with the random sequence.

In step S120, the terminal 200 may determine interleaving parameters. The terminal 200 may determine the interleaving parameters based on the terminal identifier received from the base station 300. For example, the process by which the terminal 200 generates the interleaving parameters may be expressed as Equation 1.

$$RNTI_{UE} = [1\ 0\ 1\ 1\ 0\ 0\ 1\ 1\ 0\ 0\ 0\ 1\ 0\ 1\ 0\ 0]$$
$$= [[1\ 0\ 1\ 1]\ [0\ 0\ 1\ 1]\ [0\ 0\ 0\ 1]\ [0\ 1\ 0\ 0]]$$
$$= [a_0\ a_1\ a_2\ a_3]$$

[Equation 1]

In Equation 1, $RNTI_{UE}$ may mean a terminal identifier, and $a_0$, $a_1$, $a_2$, and $a_3$ mean the interleaving parameters of the terminal 200.

Referring to Equation 1, the terminal 200 may determine the interleaving parameters from s bit string of the terminal identifier $RNTI_{UE}$. The terminal 200 may divide the bit string of the terminal identifier $RNTI_{UE}$ into a plurality of bit strings of a predetermined size. As shown in Equation 1, in a case that the $RNTI_{UE}$ has a size of 16-bits, the terminal 200 may divide the $RNTI_{UE}$ into bit strings each of which has a size of 4 bits. For example, the terminal 200 may sequentially divide [1 0 1 1 0 0 1 1 0 0 0 1 0 1 0 0], and output [1 0 1 1], [0 0 1 1], [0 0 0 1], and [0 1 0 0]. Although Equation 1 shows an example in which the bit string of $RNTI_{UE}$ is sequentially divided, the embodiments of the present disclosure are not limited thereto. For example, k-th bit string may include (4n+k)-th (n=0, 1, 2, 3; k=1, 2, 3, 4) components of bit string of $RNTI_{UE}$.

The terminal 200 may change binary numbers represented respectively by the bit strings [1 0 1 1], [0 0 1 1], [0 0 0 1], and [0 1 0 0] into decimal numbers and output the decimal numbers as the interleaving parameters $a_0$, $a_1$, $a_2$, and $a_3$, respectively.

In step S140, the terminal 200 may interleave the channel-coded data block b (.) by using the interleaving parameters $a_0$, $a_1$, $a_2$, and $a_3$. The terminal 200 may interleave channel-coded data block with a block interleaving scheme. The terminal 200 may divide the channel-coded data block into a plurality of sub-blocks. The terminal 200 may interleave each of the plurality of sub-blocks. Interleaving in the block interleaving process may be performed for each sub-block, and an order of the bit string may be changed within each sub-block. An index i for the block interleaving may be expressed as Equation 2.

$$i = [z \bmod L_{itlv}]$$
$$z = 0, 1, 2, \ldots, D-1$$

[Equation 2]

In Equation 2, D may mean a bit size of the channel coded data block output from the channel coding block 210. $L_{itlv}$ may mean a bit size of each the sub-blocks in the block interleaving. For example, if the bit size of each the sub-blocks $L_{itlv}$=32, index i may have one of values from 0 to 31. The channel coded data block may be divided into the plurality of sub-blocks each of which has a size of 32 bits. Since the index i is used in the block interleaving process, an order of bit string may be changed only within a 32-bit sized sub-block in the block interleaving process. Thus, interleaving and deinterleaving processes of the channel coded data block may be simplified.

According to Equation 2, the number of sub-blocks in the block interleaving may be $$\frac{D}{L_{itlv}}.$$

If D is not a multiple of $L_{itlv}$ the terminal 200 may add a padding sequence shorter than $L_{itlv}$ to the channel coded data block. The padding sequence may be a sequence of all zeros. The terminal 200 may add the padding sequence to the channel-coded block so as to be $((D+n_{padding}) \mod L_{itlv})=0$. Here, $n_{padding}$ may mean a bit size of the padding sequence.

In the block interleaving process, the terminal 200 may perform block interleaving multiple times consecutively. For example, the first interleaving process may be expressed as Equation 3.

$$s_0((a_3 + i) \mod L_{itlv}) = b(i), \quad \text{[Equation 3]}$$

$$s_1\left(\left(\frac{L_{itlv}}{2}\right) \cdot (i \mod 2) + \left[\frac{i}{2}\right]\right) = s_0(i)$$

In Equation 3, b(i) may mean the i-th component of the channel-coded data block output from the channel coding block 210. a mod b may mean the remainder obtained by dividing a by b.

Referring to Equation 3, the terminal 200 may interleave the channel-coded data block on a block-by-block basis using a first interleaving parameter $a_3$ among the interleaving parameters $a_0$, $a_1$, $a_2$, and $a_3$. The terminal 200 may interleave one of the sub-blocks to obtain a bit string $s_0$. The terminal 200 may obtain a bit string $s_1$ by interleaving the bit string $s_0$ according to Equation 3. The terminal 200 may obtain the bit string $s_1$ as a result of the first interleaving process.

When the first interleaving process is completed, the terminal 200 may perform a second interleaving process using a different interleaving parameter than the first interleaving parameter $a_3$ used in the first interleaving process. For example, the terminal 200 may interleave the bit string $s_1$ using a second interleaving parameter $a_2$. The second interleaving process may be expressed as Equation 4.

$$s_2((a_2 + i) \mod L_{itlv}) = s_1(i), \quad \text{[Equation 4]}$$

$$s_3\left(2 \cdot \left[\frac{i}{2}\right] + (i + L_{itlv} - [2 \cdot i]) \mod 2\right) = s_2(i)$$

Referring to Equation 4, the terminal 200 may interleave the bit string $s_1$ resulting from the first interleaving process. The terminal 200 may obtain a bit string $s_2$ as shown in Equation 4 using a second interleaving parameter $a_2$. The terminal 200 may interleave the bit string $s_2$ and obtain a bit string $s_3$.

When the second interleaving process is completed, the terminal 200 may perform a third interleaving process using a different interleaving parameter than the first interleaving parameter $a_3$ and the second interleaving parameter $a_2$ used in the first and second interleaving process. For example, the terminal 200 may interleave bit string $s_3$ using a third interleaving parameter $a_1$. The third interleaving process may be expressed as Equation 5.

$$s_4((a_1 + i) \mod L_{itlv}) = s_3(i), \quad \text{[Equation 5]}$$

$$s_5(i) = s_4\left(\left(\frac{L_{itlv}}{4}\right) \cdot (i \mod 4) + \left[\frac{i}{4}\right]\right)$$

Referring to Equation 5, the terminal 200 may interleave the bit string $s_3$ resulting from the second interleaving process using the third interleaving parameter $a_1$. The terminal 200 may obtain the bit string $s_3$ as shown in Equation 5 using the third interleaving parameter $a_1$. The terminal 200 may interleave bit string $s_3$ and obtain a bit string $s_4$.

When the third interleaving process is completed, the terminal 200 may perform a fourth interleaving process using a different interleaving parameter than the first through third interleaving parameters $a_3$, $a_2$, and $a_1$ used in the first to third interleaving process. For example, the terminal 200 may interleave the bit string $s_5$ using a fourth interleaving parameter $a_0$. The fourth interleaving process may be expressed as Equation 6.

$$s_6((a_0+i) \mod L_{itlv}) = s_5(i) \quad \text{[Equation 6]}$$

Referring to Equation 6, the terminal 200 may interleave the bit string $s_5$ using the fourth interleaving parameter $a_0$. The terminal 200 may interleave the bit string $s_5$ and obtain a bit string $s_6$.

As described with reference to Equations 3 to 6, if the interleaving is performed a plurality of times using the interleaving parameters, in most cases, the interleaving pattern may be uniquely determined according to the identifier $RNTI_{UE}$ of the terminal 200. That is, terminals having different terminal identifiers may interleave each of the sub-blocks with different interleaving patterns. Accordingly, the base station 300 may identify the terminal 200 transmitting an uplink signal by deinterleaving the uplink signal received from the terminal 200.

In step S150, the terminal 200 may perform random interleaving. The terminal 200 may perform random interleaving using the random sequence received in step S115. For example, the random sequence may be expressed as Equation 7. The random sequence may be changed according to the design of the system rather than the sequence expressed in Equation 7. Any random sequence may be applied if the terminal 200 and the base station 300 share information about the random sequence.

$$v_{real}(i)=\{21,15,2,13,27,14,11,5,17,8,31,3,29,22,10,19\}$$

$$v_{imag}(i)=\{12,9,6,24,16,23,18,7,26,30,4,0,25,20,1,28\} \quad \text{[Equation 7]}$$

In Equation 7, $v_{real}$ may mean a first random sequence used to interleave the real part of the sub-block. $v_{imag}$ may mean a second random sequence used to interleave the imaginary part of the sub-block.

Referring to Equation 7, the size of each of the first random sequence and the second random sequence may be half of size of the block $L_{itlv}$ (for example, 32 bits). The numerical arrangement of the first random sequence and the second random sequence shown in Equation 7 is merely an example, and the embodiment is not limited thereto.

The terminal 200 may interleave bit string $s_6$ obtained through Equation 6 using the first random sequence and the second random sequence. The random interleaving process may be expressed as Equation 8.

$$s_{real}\left(\left(\frac{L_{itlv}}{2}\right) \cdot m + i\right) = s_6(v_{real}(i)), \quad \text{[Equation 8]}$$

$$s_{imag}\left(\left(\frac{L_{itlv}}{2}\right) \cdot m + i\right) = s_6(v_{imag}(i))$$

In Equation 7, $s_{real}$ may mean a bit string used for a real part of an uplink signal. And $s_{image}$ may mean a bit string used in the imaginary part of the uplink signal. The range of m in Equation 8 may be determined by Equation 9.

$$m=0,1,2,\ldots,D/(L_{itlv}/2)-1 \quad \text{[Equation 9]}$$

Referring to Equation 9, the value of m may have one of the values from 0 to $D/(L_{itlv}/2)-1$. The value of m may be different for each of the plurality of sub-blocks. The value of m applied to each block may be determined randomly. For example, the value of m applied to each of the plurality of sub-blocks may be determined from a random row of matrices of Latin squares. For example, if the row determining the m value is [0, 1, 2, 3, 4], m=0 is applied to the interleaving of a first sub-block. And m=1 is applied to a second sub-block. In this case, interleaving may be performed for each of the plurality of sub-blocks, and the interleaving may not be performed between different sub-blocks.

As another example, if the row determining the m value is [1, 2, 4, 0, 3], components of a bit string of the second sub-block are arranged in the first sub-block, and components of a bit string of the first sub-block are arranged in the fourth sub-block. That is, interleaving between different sub-blocks may be performed.

The interleaving process has been described above with reference to Equations (1) to (9). In the interleaving process, the interleaving parameters $a_0$, $a_1$, $a_2$ and $a_3$ determined from the terminal identifiers are used. In the above example, each of $a_0$, $a_1$, $a_2$ and $a_3$ may have a value of 0 to 15. However, the embodiments of present disclosure are not limited thereto. For example, if the number of terminals connected to the base station 300 is small, the terminal 200 may limit the range of the values of the interleaving parameters to further simplify interleaving process. For example, the terminal 200 may limit the values of the interleaving parameters to 0 to 2. In this case, the terminal 200 may determine the interleaving parameters as the remainders obtained by dividing each of the numbers represented respectively by our bit strings each of which has a size of 4 bits. However, the method by which the terminal 200 determines the interleaving parameter is not limited to the above-described example.

The terminal 200 may transmit the plurality of sub-blocks on which the block interleaving and the random interleaving have been performed. As another example, the terminal 200 may further perform scrambling on the plurality of sub-blocks on which the block interleaving and the random interleaving have been performed.

Referring again to FIG. 4, in step S160, the terminal 200 may perform scrambling on the plurality of sub-blocks on which the block interleaving has been performed. In the scrambling process, the terminal 200 may change bit components of the sequence according to predetermined rules. For example, the terminal 200 may perform scrambling according to Equation 10.

$$e_{real}(i)=(s_{real}(i)+c(i)_{RNTI_{cell}})\bmod 2,$$

$$e_{imag}(i)=(s_{imag}(i)+c(i)+c(i)_{RNTI_{cell}})\bmod 2 \quad \text{[Equation 10]}$$

Referring to Equation 10, the terminal 200 may perform the scrambling on a bit string $s_{real}$ to obtain a bit string $e_{real}$. The terminal 200 may perform scrambling on the bit string $s_{imag}$ to obtain a bit string $e_{imag}$. The terminal 200 may add a pseudo-random sequence $c(i)_{RNTI_{cell}}$ to the bit string $s_{real}$ and then perform a 2-modulo operation to obtain a bit string $e_{real}$. Each component of the bit string $e_{real}$ may be 0 or 1. The terminal 200 may add the pseudo-random sequence to bit string $s_{map}$ and then perform a 2-modulo operation to obtain the bit string $e_{imag}$. Each component of the bit string $e_{imag}$ may be 0 or 1.

The pseudo-random sequence $c(i)_{RNTI_{cell}}$ may be determined by the cell ID of the base station 300 to which the terminal 200 belongs. For example, the pseudo-random sequence may be determined by Equation 11.

$$c(i)_{RNTI_{cell}}=(x_1(i+50)+x_2(i+50))\bmod 2$$

$$x_1(i+31)=(x_1(i+3)+x_1(i))\bmod 2$$

$$x_2(i+3)=(x_2(i+3)+x_2(i+2)+x_2(i+1)+x_2(i))\bmod 2,$$

$$i=0,1,2,\ldots,D-1 \quad \text{[Equation 11]}$$

In Equation 11, initial shift register value of $x_1$ may be determined to be $x_1(0)=1$, $\{x_1(k)=0, k=1, 2, \ldots 30\}$. In addition, the initial shift register value of $x_2$ may be determined depending on the cell ID of the base station 300. For example, the initial shift register value of $x_2$ may be determined by Equation 12.

$$\Sigma_{k=0}^{k=15}RNTI_{cell}(k)\cdot 2^k=\Sigma_{k=0}^{k=30}x_2(k)\cdot 2^k \quad \text{[Equation 12]}$$

The sequence $x_2$ may be determined to satisfy equation 11 and equation 12. Referring to equation 12, the sequence $x_2$ may depend on the cell ID $RNTI_{CELL}$ of the base station 300. The terminal 200 may perform a 2-modulo operation on each component of sum of sequence $x_1$ and sequence $x_2$ to obtain a pseudo-random sequence. The terminal 200 may perform scrambling using the pseudo-random sequence.

In step S170, the terminal 200 may transmit the plurality of sub-blocks on which the block interleaving has been performed through an uplink signal. The base station 300 may receive the uplink signal from the terminal 200.

In step S180, the base station 300 may demodulate the uplink signal received from the terminal 200. In the demodulation process, the base station 300 may perform deinterleaving process. The base station 300 may verify a result of the deinterleaving process while applying different deinterleaving schemes. The base station 300 may check whether the deinterleaving is normally performed, and check an interleaver of the uplink signal. The base station 300 may identify the terminal 200 transmitting the uplink signal by checking the interleaver of the uplink signal.

As described above, the base station 300 may identify the terminal 200 by checking the interleaver in the process of demodulating the uplink signal. However, if the number of terminals connected to the base station 300 is large, it may be difficult to check all interleavers available from the base station 300. Accordingly, the base station 300 may allocate a signal transmission time to each of the terminals. In a case that the base station 300 identifies a terminal transmitting the uplink signal, the base station 300 may consider only a candidate set determined according to the time of transmission of uplink signal, not all terminals.

Figure 5:
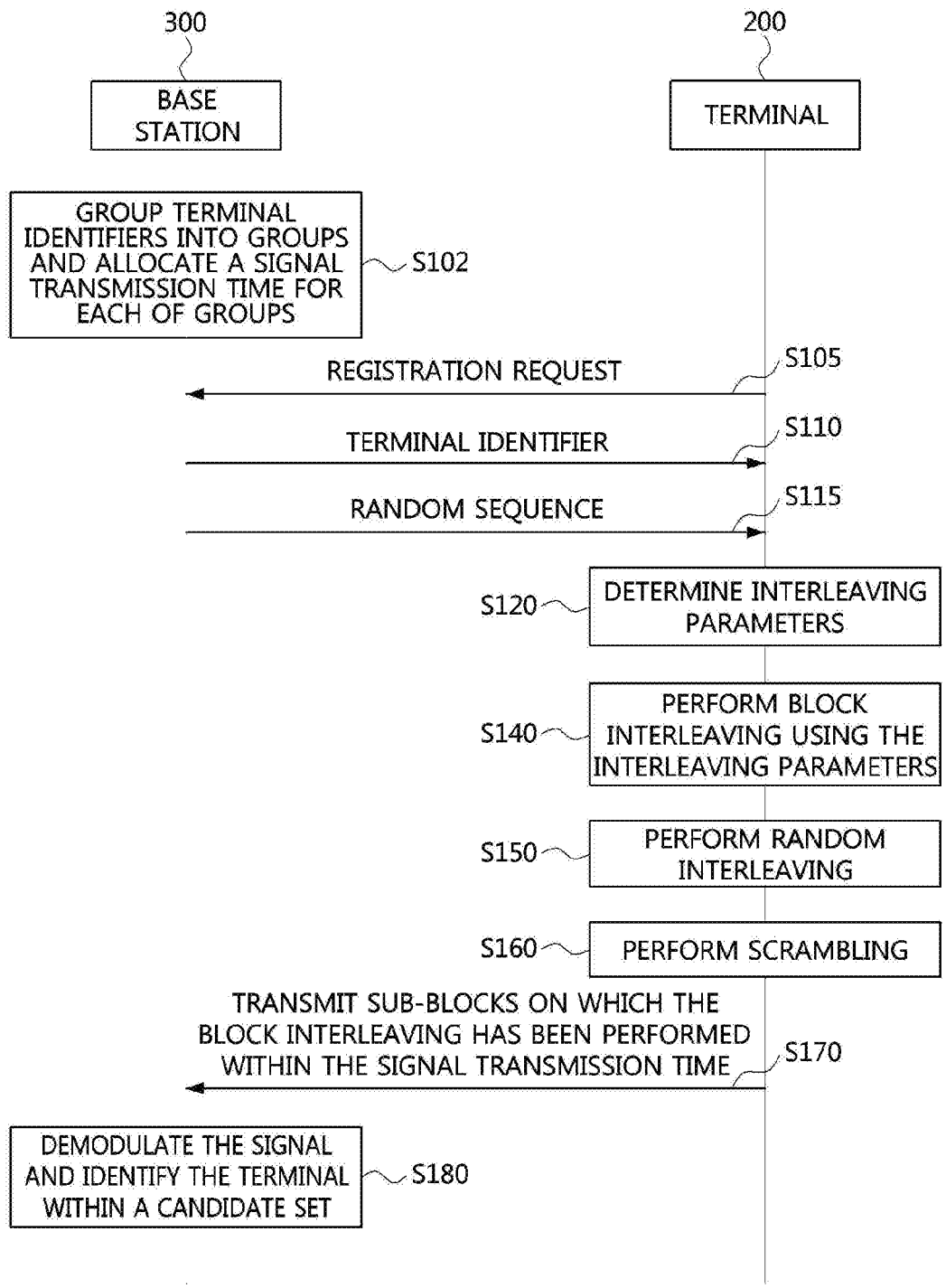
FIG. 5 is a flowchart illustrating an uplink signal transmission procedure according to a fourth embodiment of the present disclosure.

FIG. 5 is a flowchart illustrating an uplink signal transmission procedure according to a fourth embodiment of the present disclosure. In the following description of the embodiment of FIG. 5, the description overlapping with FIG. 4 is omitted.

Referring to FIG. 5, in step S102, the base station 300 may group terminal identifiers into a plurality of groups. The base station 300 may allocate a signal transmission time to each of the groups. The base station 300 may allocate different signal transmission times to different groups.

In step S112, the base station 300 may transmit information about the signal transmission time allocated to the terminal identifier of the terminal 200. The terminal 200 may receive the information about the signal transmission time from the base station 300. The terminal 200 may receive the information about the signal transmission time and determine the time to transmit the uplink signal.

In step S170, the terminal 200 may transmit uplink signal within a signal transmission time allocated to the terminal 200. The terminal 200 may transmit the sub-blocks on which the block interleaving has been performed through uplink signal.

Figure 6:
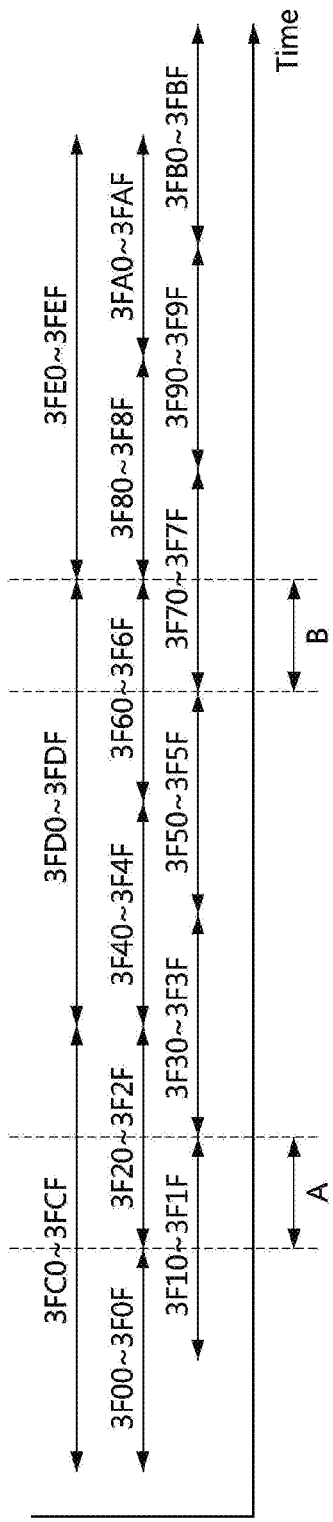
FIG. 6 is a conceptual diagram illustrating an allocation of the transmission time for each of groups.

FIG. 6 is a conceptual diagram illustrating an allocation of the transmission time for each of groups.

Referring to FIG. 6, each of the groups may include a plurality of terminal identifiers. For example, the first group may include terminal identifiers in the range of 3FC0 to 3FCF. The second group may include terminal identifiers in the range of 3FD0 to 3FDF. The base station 300 may allocate different signal transmission times to different groups.

For example, the base station 300 may receive uplink signal within an interval A. In this case, the base station 300 may limit the range of the terminal identifier to 3FC0 to 3FCF, 3F20 to 3F2F, and 3F10 to 3F1F. As another example, in a case that the base station 300 receives uplink signal within an interval B, the base station 300 may limit the range of the terminal identifier to 3FD0 to 3FDF, 3F60 to 3F6F, 3F70 to 3F7F.

The base station 300 may identify a terminal within a limited group based on the time of reception of the uplink signal. For example, in a case that the base station 300 receives the uplink signal within the A interval, the number of deinterleaving schemes may be reduced in consideration of the above-described range of the terminal identifier. By reducing the number of cases of the deinterleaving schemes of the base station 300, time and resources for signal demodulation and identification of terminal may be reduced.

Figure 7:
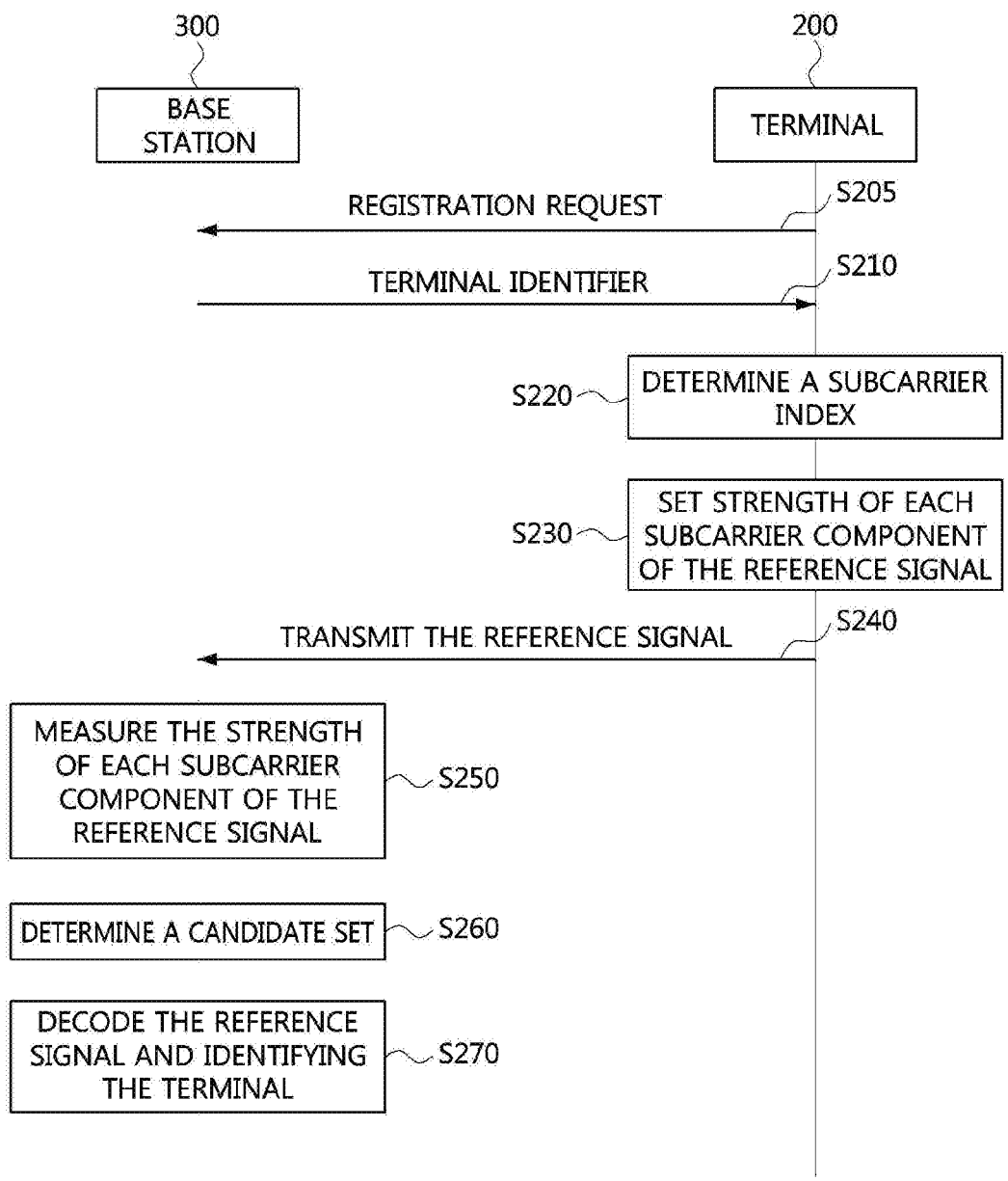
FIG. 7 is a flowchart illustrating uplink signal transmission process according to a fifth embodiment of the present disclosure.

FIG. 7 is a flowchart illustrating uplink signal transmission process according to a fifth embodiment of the present disclosure.

In step S205, the terminal 200 may transmit a registration request. The base station 300 may receive the registration request from the terminal 200. The base station 300 may manage information of the terminal 200 and provide a service to the terminal 200. For example, the terminal identifier may comprise Cell Ratio Network Temporary Identifier (C-RNTI). The terminal identifier may have a size of 16 bits. However, the above-described examples and numerical values are illustrative only and the embodiments of the present disclosure are not limited thereto. For example, the terminal identifier may have size smaller than or larger than 16 bits.

In step S210, the base station 300 may transmit information about the terminal identifier in response to the registration request. The terminal 200 may receive the information about the terminal identifier from the base station 300.

In step S220, the terminal 200 may determine a subcarrier index from the terminal identifier. The terminal 200 may divide the terminal identifier into multiple bit strings having a predetermined size and determine the subcarrier index using numbers represented respectively by the multiple bit strings. For example, the terminal 200 may divide the 16-bits terminal identifier into four bit strings each of which has a size of 4 bits and determine numbers represented respectively by the four bit strings as $a_0$, $a_1$, a, and $a_3$, as described with reference to Equation 1. The terminal 200 may determine a subcarrier index using $a_0$, $a_1$, $a_2$, and $a_3$. For example, the subcarrier index may be determined by equation 13.

$$k_{sel} = (4096 \cdot a_3 + 256 \cdot a_2 + 16 \cdot a_1 + a_0) \bmod N_{u\_max} \quad \text{[Equation 13]}$$

In Equation 13, $k_{sel}$ may mean a subcarrier index corresponding to the terminal identifier. $N_{u\_max}$ may mean the number of effective subcarriers of the OFDM symbol frequency axis.

Referring to Equation 13, the subcarrier index $k_{sel}$ used by the terminal 200 for transmitting the reference signal may depend on the parameters $a_0$, $a_1$, $a_2$ and $a_3$ derived from the terminal identifier of the terminal 200.

In step S230, the terminal 200 may set a signal strength of each subcarrier component. The terminal 200 may transmit a reference signal according to the determined signal strength of each subcarrier component determined in step S220. For example, the terminal 200 may generate the reference signal as shown in equation 14.

$$x_n = \frac{1}{N} \sum_{k=0}^{N-1} X_k \cdot e^{j2\pi \cdot k \cdot n/N}, n = 0, 1, 2, \ldots N-1 \quad \text{[Equation 14]}$$

$$X_k = 1,$$

$$k = k_{sel} = (4096 \cdot a_3 + 256 \cdot a_2 + 16 \cdot a_1 + a_0) \bmod N_{u\_max}$$

$$X_k = 0, k \neq k_{sel}$$

In Equation 14, $x_n$ may mean a reference signal. $X_k$ may mean a vector representing k-th subcarrier component of $x_n$. Referring to Equation 14, $X_k$ may not be 0 only in a case that $k=k_{sel}$. The terminal 200 may set signal strengths of components excluding a component corresponding to the subcarrier index obtained in Equation 13 to be smaller than a threshold value.

In step S240, the terminal 200 may transmit the reference signal. The base station 300 may receive the reference signal from the terminal 200.

Figure 8:
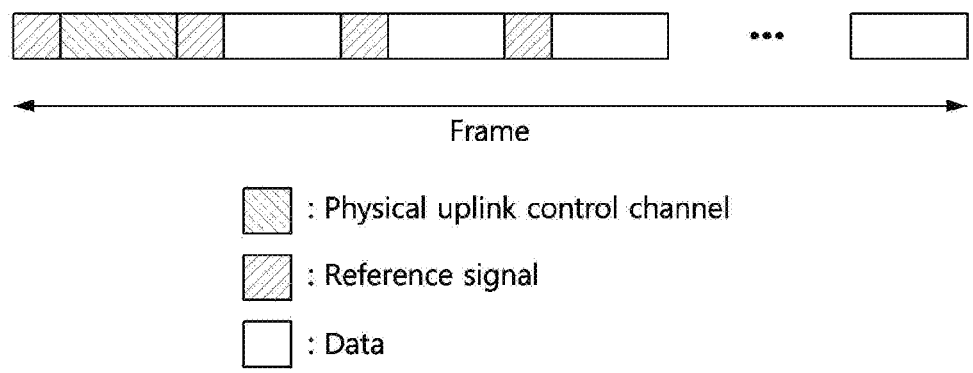
FIG. 8 is a conceptual diagram showing reference signal transmission of the terminal 200 in the time domain.

FIG. 8 is a conceptual diagram showing reference signal transmission of the terminal 200 in the time domain.

Referring to FIG. 8, the terminal 200 may periodically transmit a reference signal. The terminal 200 may arrange reference signal transmission interval between data transmission intervals.

In step S250, the base station 300 may measure the reference signal received from the terminal 200. The base station 300 may measure a signal strength of each subcarrier component of the reference signal. The base station 300 may compare the signal strength of each subcarrier component of the reference signal to predetermined threshold value. For example, the base station 300 may analyze the signal strength of each subcarrier component of the reference signal as shown in equation 15.

$$X_k = \sum_{n=0}^{N-1} x_n \cdot e^{j2\pi \cdot k \cdot \frac{n}{N}}, k = 0, 1, 2, \ldots N_{u\_max} \quad \text{[Equation 15]}$$

if $|X_k| > \delta_{thes}$, $X_{det}(k) = 1$ else $X_{det}(k) = 0$

Referring to Equation 15, the base station 300 may compare the signal strength of the reference signal with predetermined threshold value $\delta_{thres}$. The base station 300 may set the $X_{det}(k)$ value to 1 if an absolute value of $X_k$ is greater than the threshold value $\delta_{thres}$. On the other hand, the base station 300 may set the $X_{det}(k)$ to 0 in a case that the absolute value of $X_k$ is smaller than the threshold value $\delta_{thres}$.

In step S260, the base station 300 may determine a candidate set for the terminal transmitting the reference signal based on the signal strength of each subcarrier component of the reference signal. The candidate set for the terminal transmitting the reference signal may be determined by a k value satisfying $X_{det}(k)=1$. For example, in a case that $X_{det}(k)$ has a value of 1 only at k=2, the base station 300 may determine the candidate set for the terminal transmitting the reference signal as a group of terminals transmitting a reference signal through subcarrier 2. For example, a group of terminals transmitting a reference signal through subcarrier 2 may include terminals assigned a terminal identifier satisfying $k_{sel}=2$ in Equation 13.

Figure 9:
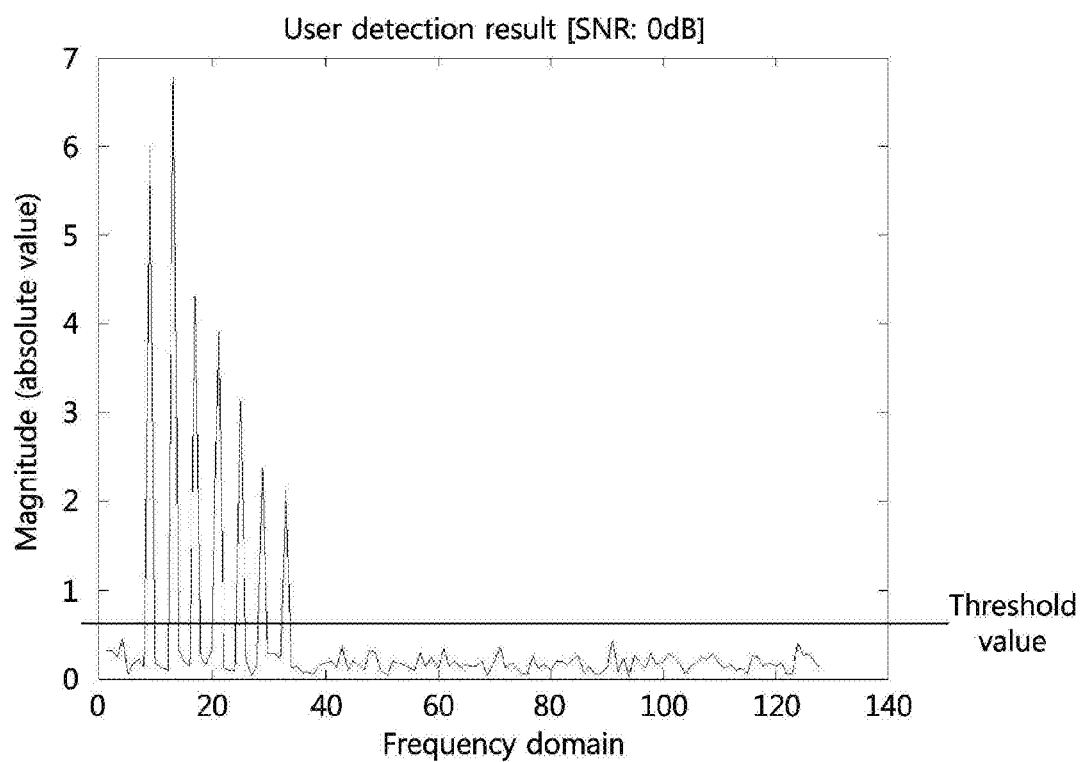
FIG. 9 is a graph showing the strength of signal received by the base station 300 in a case that seven terminals transmit reference signals.

FIG. 9 is a graph showing the strength of signal received by the base station 300 in a case that seven terminals transmit reference signals.

In FIG. 9, the horizontal axis represents the subcarrier index, and the vertical axis represents the strength of signal. Referring to FIG. 9, signal strengths of a subcarrier indices k=9, 13, 17, 21, 25, 29, 34 may exceed the threshold value. In this case, the base station 300 may determine the terminal groups transmitting reference signal using the above-described subcarrier components as candidate sets. The base station 300 may decode a reference signal transmitted through a 9th subcarrier in the decoding schemes corresponding to the candidate set using the 9th subcarrier. Similarly, the base station 300 may decode the reference signal transmitted through a 13th subcarrier with decoding schemes corresponding to the candidate set using the 13th subcarrier.

The accuracy with which the base station 300 determines the candidate may depend on the threshold value $\delta_{thres}$ in equation 15.

Figure 10:
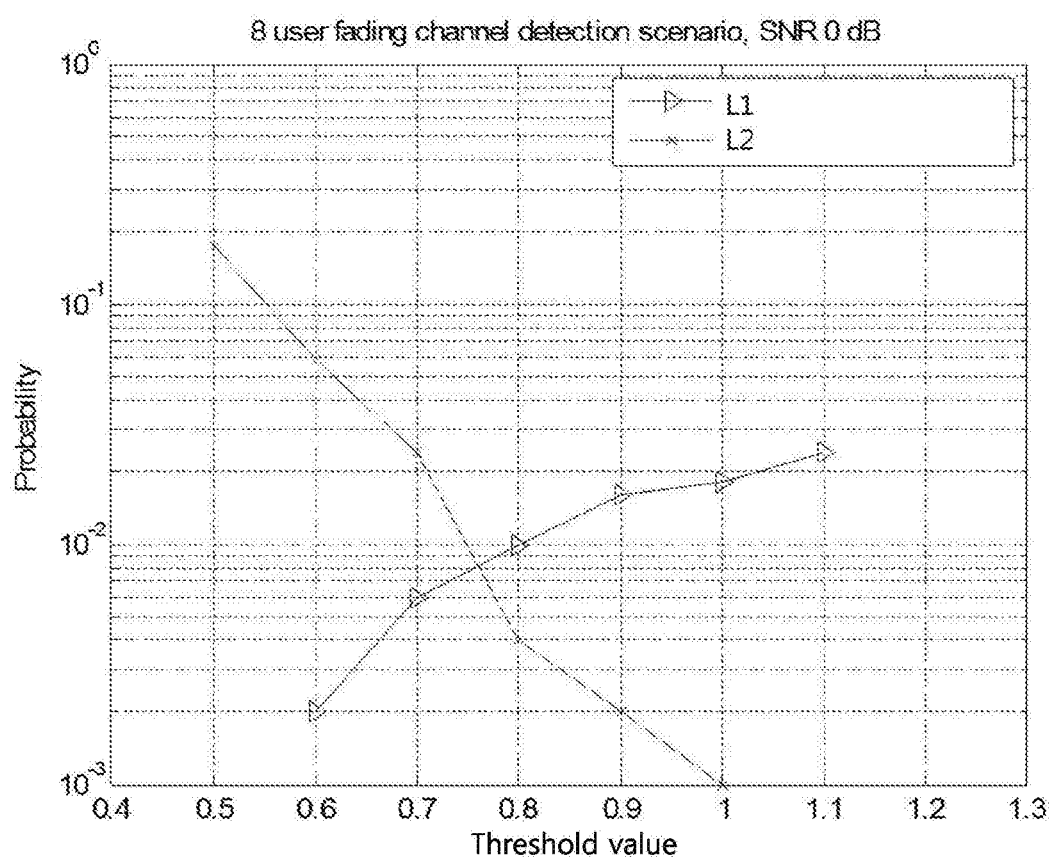
FIG. 10 is a graph showing performance of the base station 300 determining a candidate set according to the threshold value.

FIG. 10 is a graph showing performance of the base station 300 determining a candidate set according to the threshold value. In FIG. 10, the horizontal axis represents a magnitude of the threshold value, and a vertical axis represents the probability value. The magnitude of the threshold value in the horizontal axis may represent the comparison value of the magnitude of the threshold value in a case that the absolute value of $X_k$ is set to 1.

The graph L1 shows a probability of failing to determine the candidate set, and the L2 graph shows a probability of determining wrong candidate set. Referring to FIG. 10, as the threshold value increases, the probability of failing to determine candidate set may be increased. However, as the threshold value increases, the probability of determining wrong candidate set may be decreased. The base station 300 may set the threshold value differently according to target performance. For example, the base station 300 may set the threshold value of 0.75, corresponding to the intersection of the two graphs.

In step S270, the base station 300 may identify the terminal 200 transmitting the reference signal in the determined candidate set. The base station 300 may apply decoding schemes corresponding to the determined candidate set to decode the reference signal.

FIG. 11 is a conceptual diagram illustrating reference signal transmission of terminals.

Referring to FIG. 11, a first terminal, a second terminal, and a fourth terminal may transmit reference signals through the same subcarriers. For example, the first terminal, the second terminal, and the fourth terminal may transmit a reference signal through a first subcarrier, a third terminal may transmit a reference signal through a second subcarrier, a fifth terminal may transmit a reference signal through a third subcarrier, and a sixth terminal may transmit a reference signal through a fourth subcarrier.

In a case that the base station 300 receives the reference signal transmitted through the first subcarrier, the base station 300 may determine the first terminal, the second terminal, and the fourth terminal as the candidate set. The base station 300 may decode the reference signal using decoding schemes corresponding to the first terminal, the second terminal, and the fourth terminal.

The base station 300 may decode the reference signal and determine whether a result of the decoding passes a cyclic redundancy check (CRC). The base station 300 may determine that the terminal corresponding to the decoding scheme that passes the CRC has transmitted the reference signal. The base station 300 may try only the decoding schemes of the terminals included in the candidate set determined in step S260 without trying all the decoding schemes of all the terminals. Therefore, the process of decoding the reference signal and identifying the terminal 200 by the base station 300 may be simplified.

FIG. 12 is a flowchart illustrating an uplink signal transmission process according to a sixth embodiment of the present disclosure. In the following description of the embodiment of FIG. 12, the description overlapping with FIG. 7 is omitted.

Referring to FIG. 12, in step S202, the base station 300 may group terminal identifiers into a plurality of groups. The base station 300 may allocate a signal transmission time for each of the groups. The base station 300 may allocate different signal transmission times to different groups.

In step S212, the base station 300 may transmit information about the signal transmission time allocated to the terminal identifier of the terminal 200. The terminal 200 may receive information about the signal transmission time from the base station 300. The terminal 200 may receive the information about the signal transmission time and determine a time to transmit the uplink signal.

In step S240, the terminal 200 may transmit a reference signal within the signal transmission time allocated to itself.

In step S260, the base station 300 may determine the first candidate set based on a signal strength of each subcarrier component of the reference signal.

In step S265, the base station 300 may determine the second candidate set based on the time at which the reference signal is received.

In step S270, the base station 300 may determine an intersection of the first candidate set and the second candidate set. The base station 300 may decode the reference signal with decoding schemes corresponding to the terminals included in the intersection. The base station 300 may identify the terminal 200 transmitting the reference signal within the intersection of the first candidate set and the second candidate set based a result of the decoding. The number of the decoding schemes used by the base station 300 may be limited to the number of terminals included in the intersection of the first candidate set and the second candidate set. Therefore, the process of decoding the reference signal and identifying the terminal 200 by the base station 300 may be simplified.

The operation methods of the terminal and the base station according to the embodiments of the present disclosure have been described above with reference to FIG. 1 through FIG. 12 and Equations 1 through 15. According to the above-described embodiments, the base station may identify a terminal transmitting the uplink signal even if the terminal is not allocated uplink resource from the base station. Further, the base station may determine candidate set for the terminal transmitting the uplink signal based on a signal strength of each subcarrier component of the uplink signal or a transmission time of the uplink signal. So a process by which the base station identifies the terminal may be simplified.

The embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the embodiments of the present disclosure and their advantages have been described in detail, it should be understood that various changes, substitutions and alterations may be made herein without departing from the scope of the present disclosure.

What is claimed is:

1. An operation method of a terminal in a mobile communication network, comprising:
   receiving a terminal identifier and information from a base station;
   generating a plurality of interleaving parameters based on the terminal identifier;
   dividing a channel-coded data block into a plurality of sub-blocks;
   performing a block interleaving on each of the plurality of sub-blocks using the plurality of interleaving parameters;
   performing a scrambling on each of the plurality of sub-blocks on which the block interleaving has been performed; and
   transmitting the plurality of sub-blocks on which the scrambling has been performed,
   wherein an interleaving pattern of the block interleaving for each of the plurality of sub-blocks is determined by the plurality of interleaving parameters, and
   wherein the scrambling on each of the plurality of sub-blocks is performed by:
   adding a pseudo-random sequence to each of the plurality of sub-blocks on which the block interleaving has been performed; and
   calculating remainders obtained by dividing each component of each of the plurality of sub-blocks to which the pseudo-random sequence is added by two.

2. The operation method according to claim 1, wherein the terminal identifier includes a Cell Radio Network Temporary Identifier (C-RNTI).

3. The operation method according to claim 1, wherein the terminal identifier has a size of 16 bits, and the plurality of interleaving parameters are generated by:
   dividing the terminal identifier into four bit strings each of which has a size of 4 bits; and
   determining numbers represented respectively by the four bit strings as first to fourth interleaving parameters.

4. The operation method according to claim 3, wherein the block interleaving is performed by:
   interleaving bit strings of each of the plurality of sub-blocks using the first interleaving parameter;
   interleaving the bit strings interleaved by the first interleaving parameter using the second interleaving parameter;
   interleaving the bit strings interleaved by the second interleaving parameter using the third interleaving parameter; and
   interleaving the bit strings interleaved by the third interleaving parameter using the fourth interleaving parameter.

5. The operation method according to claim 1, further comprising:
   receiving information of a signal transmission time allocated to a group of terminals to which the terminal belongs from the base station,
   wherein the plurality of sub-blocks are transmitted at the signal transmission time.

6. An operation method of a terminal in a mobile communication network, comprising:
   receiving a terminal identifier from a base station;
   dividing the terminal identifier into a plurality of bit strings of a predetermined size;
   determining numbers represented respectively by a plurality of bit strings as a plurality of interleaving parameters;
   dividing a channel-coded data block into a plurality of sub-blocks;
   performing a block interleaving on each of the plurality of sub-blocks using the plurality of interleaving parameters; and
   transmitting the plurality of sub-blocks on which the block interleaving has been performed,
   wherein an interleaving pattern of the block interleaving for each of the plurality of sub-blocks is determined by the plurality of interleaving parameters.

7. An operation method of a terminal in a mobile communication network, comprising:
   receiving a terminal identifier from a base station;
   generating a plurality of interleaving parameters based on the terminal identifier;
   dividing a channel-coded data block into a plurality of sub-blocks;
   performing a block interleaving on each of the plurality of sub-blocks using the plurality of interleaving parameters;
   receiving a random sequence from the base station;
   performing a random interleaving on each of the plurality of sub-blocks on which the block interleaving has been performed by using the random sequence; and
   transmitting the plurality of sub-blocks on which the random interleaving has been performed,
   wherein an interleaving pattern of the block interleaving for each of the plurality of sub-blocks is determined by the plurality of interleaving parameters.

8. An operation method of a base station in a mobile communication network, comprising:
   transmitting a terminal identifier and information of a signal transmission time allocated to a group of terminals to which a terminal belongs to the terminal;
   receiving a plurality of sub-blocks on which a block interleaving has been performed at a first time period;
   identifying the terminal identifier based on the signal transmission time allocated to the group of terminals and an interleaving pattern of the block interleaving for each of the plurality of sub-blocks,
wherein the interleaving pattern is determined by a plurality of interleaving parameters.

* * * * *